United States Patent [19]

Cronin

[11] Patent Number: 5,633,780

[45] Date of Patent: May 27, 1997

[54] ELECTROSTATIC DISCHARGE PROTECTION DEVICE

[75] Inventor: David V. Cronin, Peabody, Mass.

[73] Assignee: Polaroid Corporation, Cambridge, Mass.

[21] Appl. No.: 634,170

[22] Filed: Apr. 18, 1996

Related U.S. Application Data

[62] Division of Ser. No. 361,426, Dec. 21, 1994, Pat. No. 5,583,733.

[51] Int. Cl.$^6$ .................................................. H01H 47/00
[52] U.S. Cl. ............................................. 361/220; 361/212
[58] Field of Search ................................ 361/56, 91, 111, 361/212, 220; 206/706, 707

[56] References Cited

U.S. PATENT DOCUMENTS

| | | | |
|---|---|---|---|
| 3,467,940 | 9/1969 | Wallo | 339/14 |
| 3,653,498 | 4/1972 | Kisor | 206/46 H |
| 3,774,075 | 11/1973 | Medesha | 317/2 R |
| 4,019,094 | 4/1977 | Dinger et al. | 361/220 |
| 4,617,605 | 10/1986 | Obrecht et al. | 361/220 |
| 4,971,568 | 11/1990 | Cronin | 439/188 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,259,777 | 11/1993 | Schuder et al. | 439/188 |
| 5,289,336 | 2/1994 | Gagliano | 361/220 |

FOREIGN PATENT DOCUMENTS

| | | |
|---|---|---|
| 0071031 | 2/1983 | European Pat. Off. . |
| 2348630 | 4/1975 | Germany . |
| 59-13353 | 1/1984 | Japan . |
| 61-148852 | 11/1986 | Japan . |
| 62-276855 | 12/1987 | Japan . |

OTHER PUBLICATIONS

Middlebrook, Carlton G., "Electrical Shorting Cap," Navy Technical Disclosure Bulletin, vol. 6, No. 3, Mar. 1981, pp. 33–36 (Navy Technology Catalog No. 5260 1530, Navy Case No. 63818).

Wang, Shay–Ping T., and Ogden, Paul, "Membrane–Type Pin Protector for Pin Grid Array Devices," 1991 IEEE/SEMI Advanced Semiconductor Manufacturing Conference, pp. 120–127.

Primary Examiner—Jeffrey A. Gaffin
Assistant Examiner—Sally C. Medley
Attorney, Agent, or Firm—John S. Vale; Christopher P. Ricci

[57] ABSTRACT

An electrostatic discharge protection device is disclosed which automatically connects selected connector pins of a semiconductor chip package ("SCP") or connectors on printed circuit boards such that the connector pins are held at a common voltage until insertion of the SCP into a receptor or until insertion of a cable into the connector which overcomes an internal resilient bias of the electrostatic discharge protection device causing the common connection to be removed. Removal of the SCP from the receptor or the cable from its connector removes the force which overcomes the bias, thereby reestablishing the common electrical connection thus automatically moving the electrostatic discharge protection device between inoperative and operative positions.

6 Claims, 19 Drawing Sheets

ELECTROSTATIC DISCHARGE PROTECTION DEVICE

This application is a division of application Ser. No. 08/361,426, filed Dec. 21, 1994, U.S. Pat. No. 5,583,733.

BACKGROUND OF THE INVENTION

The present invention relates generally to electrostatic discharge protection devices. More particularly, the invention relates to electrostatic discharge protection devices for semiconductor chip packages ("SCP") where the electrostatic discharge protection device connects selected pins on the SCP so they are grounded or maintained at the same electrical potential to inhibit electrostatic charge accumulation when the SCP is not mounted on a receptor such as a circuit board, and disconnects the ground connection upon operative combination of the SCP on the receptor.

Electrostatic charge is a stationary electric charge which accumulates on various surfaces. An electrostatic discharge occurs when the electrostatic charge becomes substantial enough to overcome a dielectric material between the charge and another surface of lower electrical potential. An example of such a discharge as naturally occurring is lightning.

Electrostatic discharge in the realm of electronics can be devastating to microelectronic devices. A sharp voltage spike caused by an electrostatic discharge can cause permanent and costly damage to individual precision devices, such as random access memory inter alia.

Many commercially available electrostatic discharge protection devices in use today consist primarily of electrostatic discharge packaging of the SCP in electrically conductive strips, pellets, boxes, and plastic tubing which provide effective electrostatic discharge protection until a user is ready to insert the SCP into complementary receptacles on the circuit board or other interconnector. At that point the user must remove the electrostatic discharge protective packaging from the SCP, thus rendering the SCP vulnerable to electrostatic discharge, in order to position and insert connector pins of the SCP into receptacles. Accordingly, as the user inserts the connector pins of the SCP into the receptacles, the semiconductor die housed within the SCP's could be destroyed by electrostatic discharge and the SCP would therefore have to be replaced.

Moreover, certain types of SCP's, typically EPROM's, UVPROM's, and Dram's are plug-in devices which have connector pins which are repeatedly inserted into and later removed from the receptacles. These types of SCP's require electrostatic discharge protection during the repeated insertions into and removal from the receptacles. Specifically, the connector pins of those SCP's require electrostatic discharge protection from the moment that their connector pins are removed from their receptacles until their connector pins are again inserted therein.

Consequently a need still exists within the semiconductor chip packaging industry for a true electrostatic discharge protection device, rather than electrostatic discharge protection packaging, which effectively protects the semiconductor die from electrostatic discharge until the connector pins of the SCP are inserted into the receptacles of the connector and then protects the semiconductor die from electrostatic discharge again when the connector pins are removed from the receptacles.

A prior art electrical connector-receptacle arrangement is described in commonly assigned U.S. Pat. No. 5,108,299 entitled "Electrostatic Discharge Protection Devices for Semiconductor Chip Packages" by David V. Cronin issued Apr. 28, 1992, which shows a shunt attachment placed on pins of the semiconductor chip package arranged to provide a short circuit across selected pins. Upon insertion into the receptor, the attachment is driven away from the semiconductor chip package, causing the short circuit to be broken. While this arrangement is an improvement and is useful for connectors for semiconductor chip packages such as Dual In-line Packages ("DIP"'s), the design is relatively expensive to manufacture. The resilient conductive metal structure secured to the DIP with an adhesive can become too costly for use with inexpensive semiconductor chip packages.

Other commonly assigned patents and copending applications include U.S. Pat. No. 4,971,568 entitled "Electrical Connector With Attachment For Automatically Shorting Select Conductors Upon Disconnection of Connector" by David V. Cronin issued Nov. 20, 1990, U.S. Pat. No. 5,163,850 entitled Electrostatic Discharge Protection Devices For Semiconductor Chip Packages" by David V. Cronin issued Nov. 17, 1992, U.S. Pat. No. 5,164,880 entitled "Electrostatic Discharge Protection Device for a Printed Circuit Board" by David V. Cronin issued Nov. 17, 1992, pending U.S. application Ser. No. 08/234,917 entitled "Electrostatic Discharge Protection Device" by David V. Cronin filed Apr. 28, 1994, and pending U.S. applications Ser. No. 08/278,024 and Ser. No. 08/278,063 each entitled "Electrostatic Discharge Protection Device" by David V. Cronin filed Jul. 20, 1994.

For the use of electrostatic discharge protection devices to be economically feasible, its cost must be relatively low compared to the value of the semiconductor device on which it is used. Devices in the above patents are of all metal construction and while they perform the electrostatic discharge protection task exceedingly well, the cost of such devices tend to preclude their use on lower-cost semiconductors which represent a large segment of the market.

Therefore, there is a need for a substantially lower cost electrostatic discharge protection device and it is an object of this invention to provide such a lower cost electrostatic discharge protection device.

Accordingly, it is an object of this invention to provide electrostatic discharge protection devices which operate to automatically open a short between selected conductors upon connection with a mating receptacle.

It is another object of the invention to provide an electrostatic discharge protection device which is inexpensive to manufacture.

These and other objects of the invention will be obvious and will appear hereinafter.

SUMMARY

The aforementioned and other objects are achieved by the invention which provides a substantially lower cost electrostatic discharge protection device for protecting a semiconductor chip package ("SCP") against electrostatic discharge. Major portions of the electrostatic discharge protection device which were made of metal in previous devices are now fabricated of plastic. A conductive portion is a conductive paint, ink, or flex-circuit technology. This construction allows the use of high volume, low-cost production processes.

The electrostatic discharge protection device works with many forms of SCP but is particularly useful with an SCP of a type having a top surface, an opposite bottom surface and a plurality of lateral surfaces integral with said top and bottom surfaces. Extending from the SCP are a plurality of connector pins disposed in a spaced apart relationship with respect to each other. The plurality of connector pins provide electrical connection points to mating receptacles on a circuit board, for example, for electrical inputs into a circuit contained within the SCP. The electrostatic discharge protection device embodying the present invention comprises a base and a grounding means.

The base is adapted to be secured below the bottom surface of said SCP. The base is fabricated of a non-conductive material to avoid a possibility of inadvertent electrical grounding of the SCP or the printed circuit board. The non-conductive material can be a low-cost plastic or other low-cost material to reduce a manufacturing expense for the electrostatic discharge protection device.

The base has a plurality of apertures corresponding to the plurality of connector pins where the apertures are spaced such that the plurality of connector pins pass through corresponding ones of the plurality of apertures. Cuts are made into the base to allow a portion of the base around the aperture to adapt to a location of each of the plurality of connector pins. The cuts and the apertures can be placed in the base by using a high-speed continuous process.

The base is fabricated to have a resilient inward bias to urge an outer edge defining such an aperture of the plurality of apertures into contact with the connector pins. The contact is maximized by dividing the base around the aperture with cuts to form independently acting legs. This physical contact serves to hold the electrostatic discharge protection device on the SCP without a need for adhesives or additional mechanical devices while also providing a point of contact for an electrical connection to the plurality of connector pins.

The grounding means is disposed on the base for the purpose of grounding selected pins of the plurality of connector pins. The grounding means has an operative position for connecting a shunt across selected pins of the plurality of connector pins and has an inoperative position for disconnecting the shunt to provide electrical isolation between the plurality of connector pins. Insertion of the SCP into the mating receptacle automatically moves said grounding means from said operative position to said inoperative position by overcoming the inward bias flattening the electrostatic discharge protection device. Likewise, removal of the SCP from the receptacle results in automatic movement of the electrostatic discharge protection device back into the operative position because the base is resilient, causing reestablishment of the inward bias.

Another aspect of the electrostatic discharge protection device is that it automatically centers itself upon being moved into the inoperative position. This ensures that electrical connections between the pins are broken and optimizes a technician's ability to visibly inspect the circuit board. The automatic centering is provided by fabricating the base such that a distance between opposed apertures is approximately that of a distance between opposed connector pins. In this way, the flattening of the electrostatic discharge protection device pushes non-conductive inner portions of the apertures into contact with the connector pins thus centering the electrostatic discharge protection device.

In further aspects, the invention provides methods in accord with the apparatus described above. The aforementioned and other aspects of the invention are evident in the drawings and in the description that follows.

BRIEF DESCRIPION OF THE DRAWINGS

The foregoing and other objects of this invention, the various features thereof, as well as the invention itself, may be more fully understood from the following description, when read together with the accompanying drawings in which.

DETAILED DESCRIPTION

Figure 1:
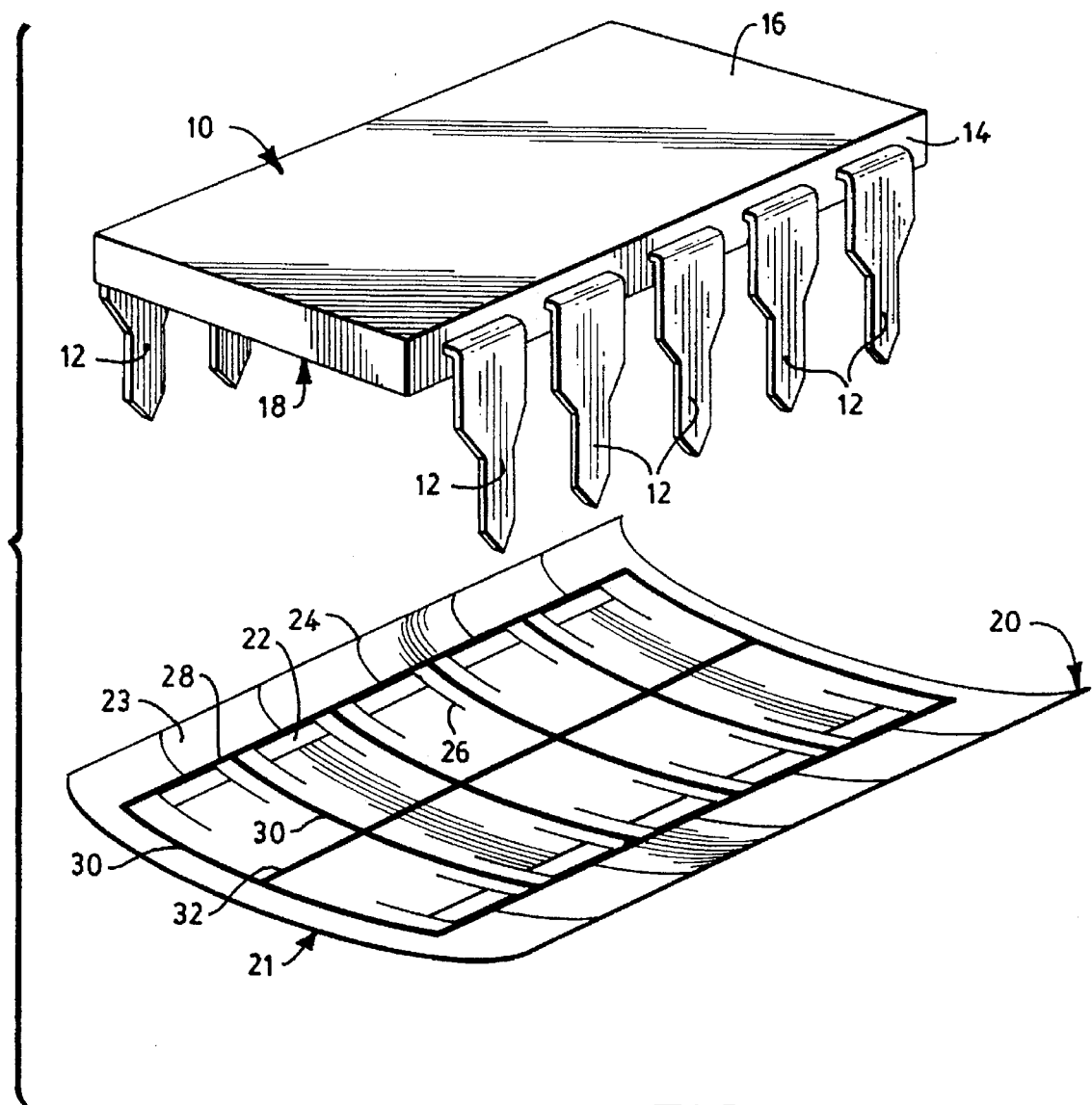
FIG. 1 depicts an exploded perspective view of an electrostatic discharge protection device of this invention disposed below a semiconductor chip package.

Referring to FIG. 1 there is shown a semiconductor chip package-electrostatic discharge protection device combination comprising a semiconductor chip package ("SCP") 10 and an electrostatic discharge protection device 20 of this invention. The SCP 10 generally comprises a top surface 16, a bottom surface 18, and, between the top and bottom surfaces, a plurality of lateral surfaces each marked 14. A plurality of connector pins 12 are disposed on two of the lateral surfaces in a substantially parallel and spaced apart relationship with respect to each other. Though the SCP pictured herein is a dual in-line package ("DIP") commonly used in electronic circuit design, one skilled in the art will recognize that the invention can also be used with other SCP's.

The plurality of connector pins are adapted for mechanical and electrical connection to a receptor, typically a printed circuit board having a substantially planar surface on one selected side thereof. The SCP 10 is inserted into the receptacles in the printed circuit board or into receptacles in a connector which has previously been soldered onto the printed circuit board.

The electrostatic discharge protection device 20 of the invention ensures that a shunt is across selected ones of the connector pins 12 until the SCP 10 is secured to the printed circuit board thus protecting a circuit housed within the SCP 10 from electrostatic discharge.

Figure 2A:
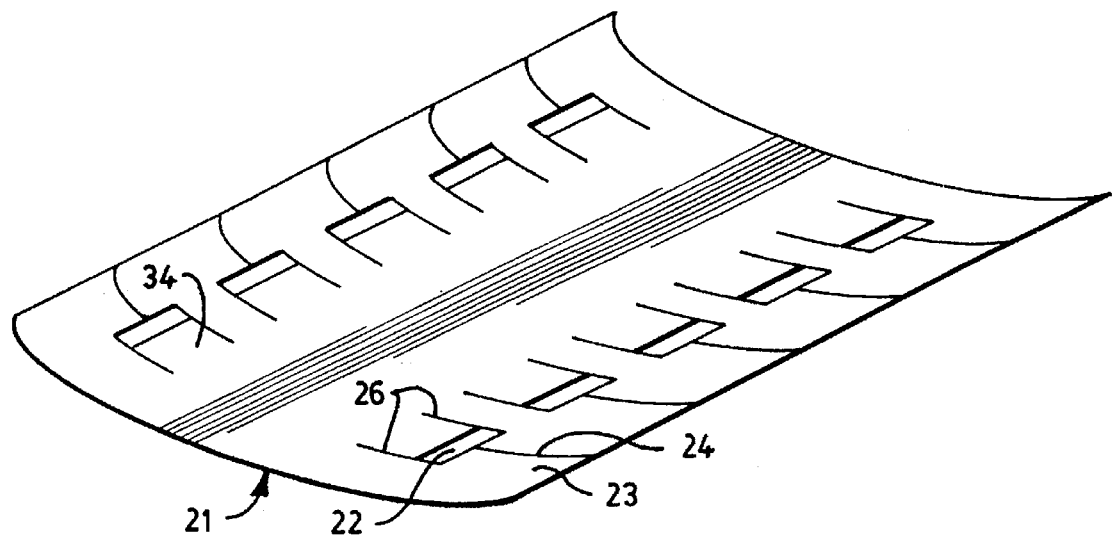
FIG. 2A shows a base structure of an electrostatic discharge protection device of this invention.

The electrostatic discharge protection device 20 of this embodiment comprises a non-conductive base section 21 which is secured below the bottom surface 18 of the SCP 10. The base section 21 as shown in FIG. 2A has apertures 22 on two sides, or as many sides as the SCP 10 has connector pins 12. The base section has center cuts 24 centered on the apertures 22 extending outward toward the periphery of the electrostatic discharge protection device 20 and two side cuts 26 extending inward from opposed sides of the aperture 22 toward a central axis of the base 21. The center cuts 24 and the side cuts 26 create tabs 23 which have a freedom of movement transverse to a plane of the base section 21.

Figure 2B:
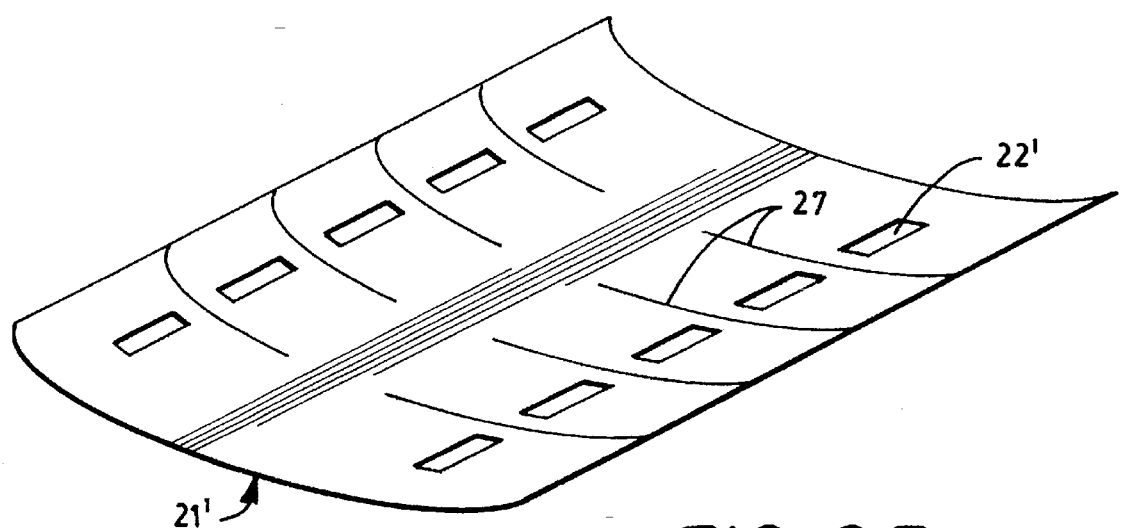
FIG. 2B shows a second embodiment of a base structure of the invention.

A second embodiment of the base section is shown in FIG. 2B where like structures are referred to with like numerals. In this embodiment unlike the previous embodiment, the apertures 22' do not have the side cuts 26 or the center cut 24. Instead, the base 21' has full cuts 27 extending inward from a perimeter of the base 21' toward the central axis of the base 21'. One skilled in the art will realize that various configurations of the base section 21' can be used as long as they allow freedom of motion relative to the aperture 22' substantially transverse to the plane of the base section 21'.

In either of the previous embodiments, the cuts serve to allow independent motion between apertures 22. The independent motion ensures that upon insertion of the connector pins 12 into the apertures 22 deviations in angles of the conductor pin 12 relative to the lateral surfaces 18 of the SCP 10 do not lead to a lack of contact with the electrostatic discharge protection device 20. In other words, if the connector pins 12 of the SCP 10 are bent such that they have varying angles with respect to each other, the cuts allow the electrostatic discharge protection device 20 to adapt to those angles ensuring mechanical contact with each conductor pin 12.

Figure 2C:
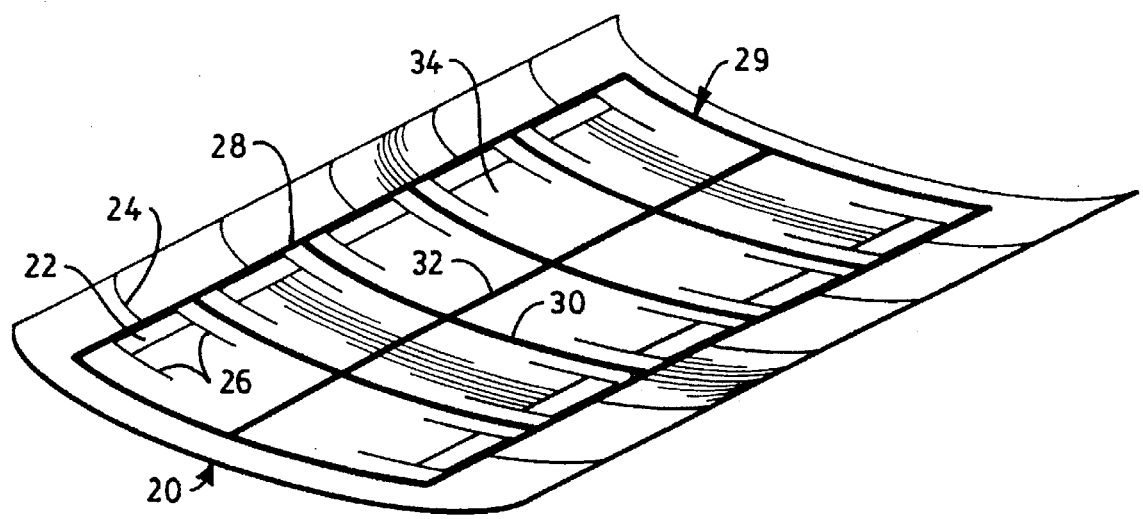
FIG. 2C shows a conductive overlay secured to the base structure of the invention as shown in FIG. 1.

The base section 21 is then overlaid with a conductive overlay 29 as illustrated in FIG. 2C. The conductive overlay 29 essentially provides a conductive matrix connecting each of a portion of the apertures 22 such that upon insertion of the connector pins 12 of the SCP 10 the connector pins will each be electrically connected.

The conductive overlay in the preferred embodiment is an electrically conductive coating of ink or paint which is printed onto the base 21 by printing processes well known in the art. One skilled in the art will realize that various forms of conductive overlay 29 can be used and the conductive coating can be applied by methods other than printing such as any method capable of patterning materials. For example, a flex-circuit technology can be used in which a conductive metal is laminated to the base section to have the above-described function.

The conductive overlay 29 consists of a central conductor running a length of the base section 21 along the central axis of the base section 21 which forms a common ground for each conductor pin 12 which is inserted into the apertures 22.

Extensions 30 extend perpendicularly to the central conductor 32 on each side of the aperture 22 which connect to ground conductors 28. The ground conductors 20 are printed transverse to the extensions electrically connecting the extensions 30 to an outer edge of the apertures 22 on the tab 23.

In applying the overlay, care is taken to ensure that some of the conductive overlay 29 extends into the aperture 22, and specifically, over the outer edge of the aperture 22. This ultimately augments an electrical connection between the conductive overlay 29 and the connector pins 12 as will be described hereinafter.

In the case of conductive ink or paint as the conductive coating, the base material is passed through a printing press which prints the conductive overlay 29 onto the base 21 with an excess of the ink, for example, along the tab 23 which forms the ground conductor 28. The excess ink then spills down along the outer edge of the aperture 22.

In the case of the flex-circuit material as the conductive overlay 29, a sheet of a conductive metal, copper for example, is laminated onto a sheet of the base material.

The conductive metal is then photo-etched or mechanically punched to form the extensions 30, the ground conductor 28 and the central conductor 32 for each electrostatic discharge protection device 20. A small overhang of the conductive metal from the ground conductor 28 is left protruding outward into an area where the apertures 22 will be formed. The laminated combination is then flipped and the base material is photo-etched to form the cuts and apertures 22. Finally, the laminated sheet is then cut into individual electrostatic discharge protection devices 20. Upon insertion of the connector pins 12 of the SCP 10 into the apertures 22, the overhang is bent down over the outer edge of the aperture 22 enhancing the electrical contact.

The conductive overlay can also be made so as to only short selected connector pins 12. The ground conductor 28 or the extension 30 can be omitted to avoid electrical connection to the central conductor 32 for those connector pins 12 for which electrostatic discharge protection is not required.

In the aforementioned second embodiment of the base 21', the extensions 30 are placed along the full cuts 27. Alternatively, the extensions 30 can be set back from the full cuts 27 creating parallel pairs of extensions 30 such that flaking of conductive paint or ink does not occur. The extensions as before run into ground conductors 28 which in turn contact the connector pins 12 as previously described.

The electrostatic discharge protection device 20 is fabricated to have an inherent resilient bias to urge the apertures upward. In doing so, the preferred embodiment of the electrostatic discharge protection device 20 forms, in a cross-section transverse to the central axis an arcuate shape. The arc is made to have a tighter curve than that required to make the apertures 22 intersect the connector pins 12 so that the base 21, being resilient and flexible, creates a bias holding the outer edge of the apertures 22 against the connector pins 12. This bias secures the electrostatic discharge protection device 20 in place without need of adhesives or additional mechanical connectors. One skilled in the art will realize that the base 21 can be fabricated to have various non-arcuate shapes accomplishing the functions described above, for example V-shaped or a half-hexagon shape.

In the preferred embodiment, the base 21 having an arcuate shape with an inherent bias is formed by fabricating the electrostatic discharge protection device 20 from a resilient plastic such as KAPTON, a trademark owned by E. I. DuPont DeNemours and Company, in a heated forming die or mandrel. Using plastic as a base material has an advantage of being non-conductive alleviating concerns of inadvertent grounding of connector pins 12 or other conductors on the circuit board 36. A further advantage is that the plastic can be run through a punch press to form necessary cuts and apertures 22 with a minimal risk of forming burrs at the punch sites.

Having been shaped in this way, the electrostatic discharge protection device 20 now has the inward bias which urges the outer edges 38 of the apertures 22 having the ground conductor 28 coated thereon, into mechanical contact with the connector pins 12.

Figure 3A:
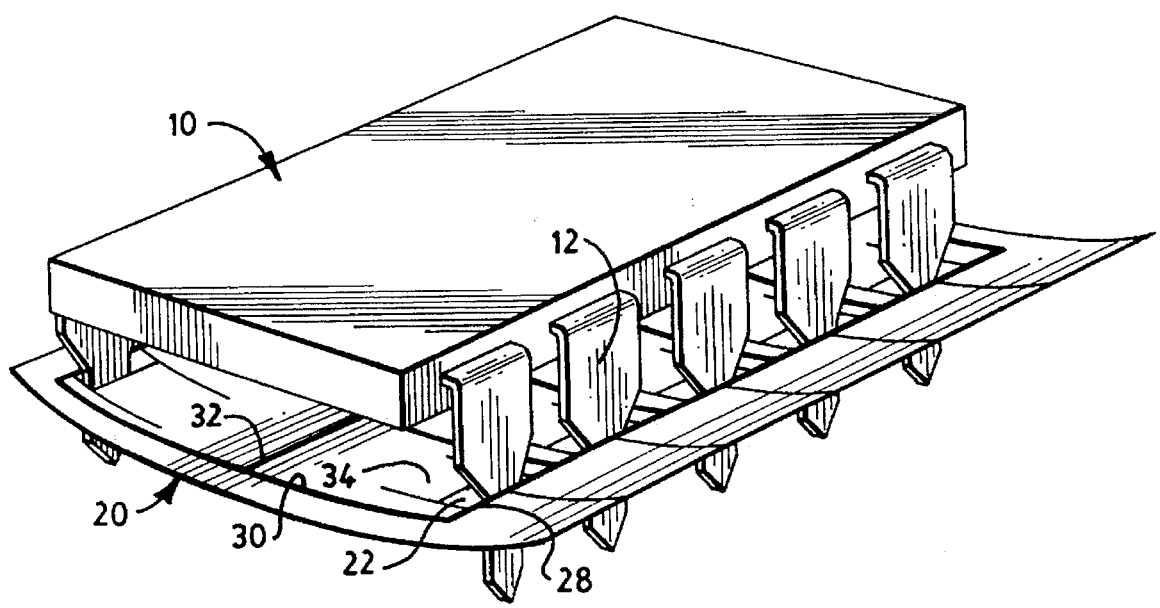
FIG. 3A shows a perspective view of the electrostatic discharge protection device shown in FIG. 2 mated with a bottom surface of the semiconductor chip package shown in FIG. 2.
Figure 3B:
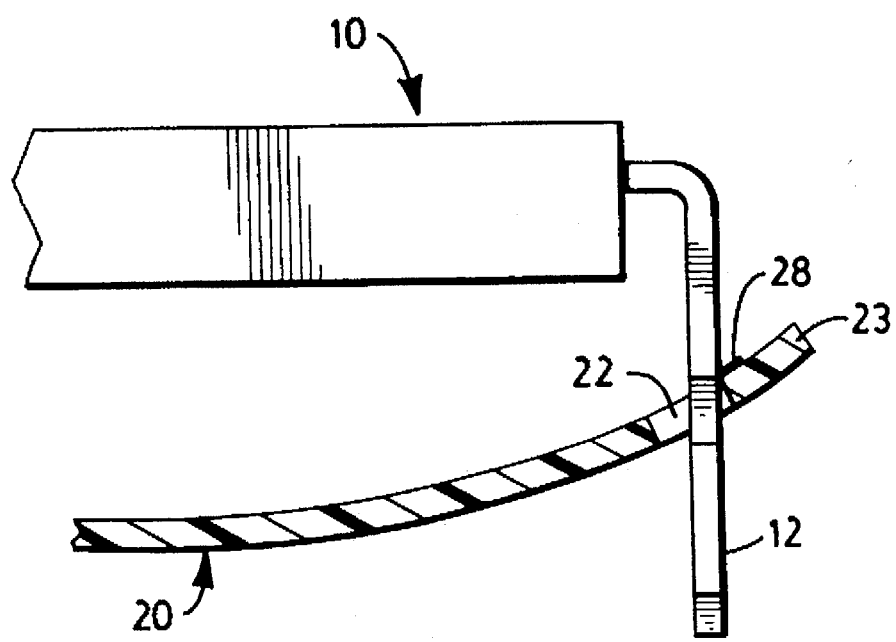
FIG. 3B shows a sectional profile of the electrostatic discharge protection device shown in FIG. 3A mated to the bottom surface of the semiconductor chip package.

The electrostatic discharge protection device 20 as shown in operative combination with the SCP 10 in FIGS. 3A and 3B. The base configuration of FIG. 2A is illustrated but one skilled in the art will realize that either base configuration operates essentially as herein described.

The connector pins 12 of the SCP pass through the apertures 22 of the electrostatic discharge protection device 20. The aforementioned resilient bias of the electrostatic discharge protection device 20 urges the outer edge 38 of the aperture 22 against the connector pins 12 such that electrical communication between the connector pins 12 and the ground conductor 28 is established.

This connection enables static charge that accumulates on any of the connector pins 12 to be communicated via the ground conductor 28 through the extension 30 into the central conductor 32. This charge is then distributed among all of the connector pins 12 which are connected to the central conductor 32 maintaining a common voltage among the connected connector pins 12 thereby protecting inner circuitry.

In the preferred embodiment, the ground conductor 28 also has a higher resistance than the central conductor 32. This is done so that electrostatic charge, if present, drains slowly to common, thus preventing high speed, harmful, induced internal transient currents. One skilled in the art will realize that the entire conductive coating or substantially any part thereof can be made to have a high resistance to accomplish the aforementioned protection.

An advantage of the first embodiment of the base 21 as shown in FIG. 2A can now be seen. The tabs 23 holding the ground conductor 28 against the connector pins 12 are bisected such that two tabs 23 are in mechanical contact with each connector pins 12. This creates a redundant electrical connection to each connector pin 12.

Figure 4:
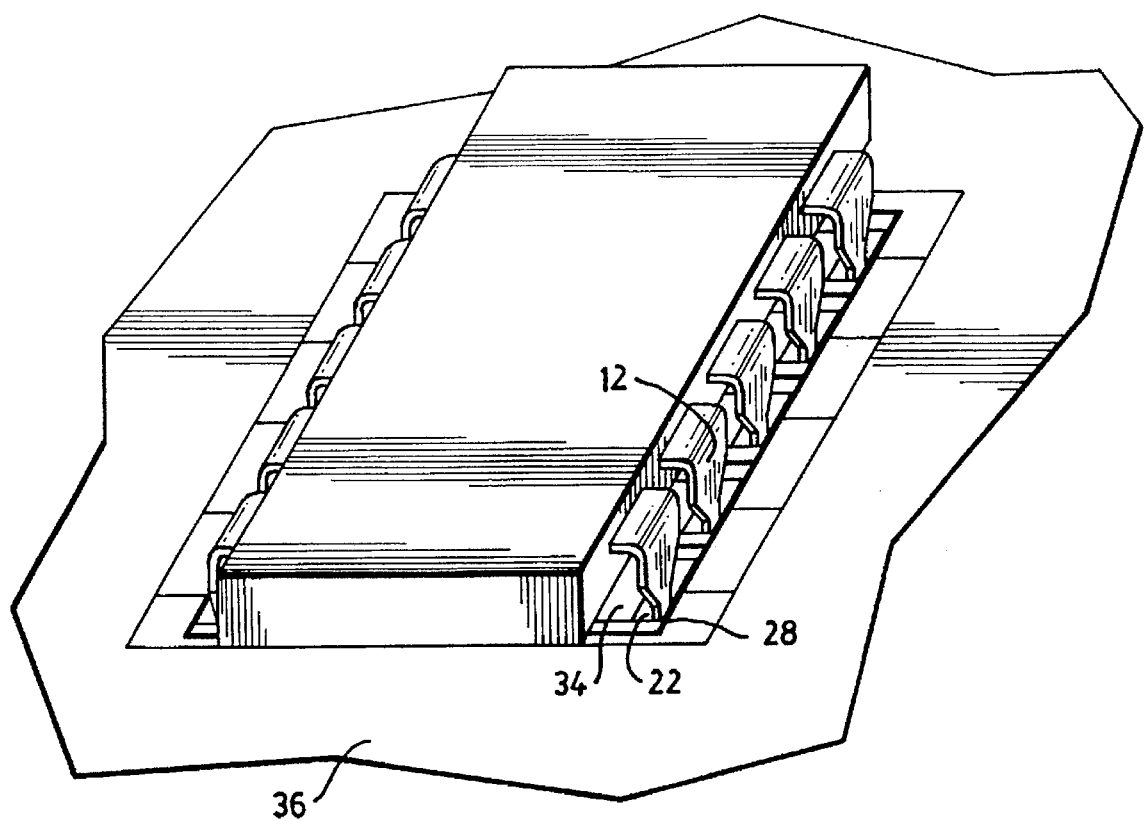
FIG. 4 shows a perspective view of the electrostatic discharge protection device assembly as shown in FIG. 3A secured to the semiconductor chip package which is mated to the circuit board.

Once the SCP 10 is inserted into the printed circuit board 36, as shown in FIG. 4, the electrical connection between the connector pins 12 is automatically disconnected returning the individual connector pins 12 to electrical isolation. This is accomplished by the action of inserting the SCP into a receptor in the printed circuit board 36. One skilled in the art will realize that the receptor can be in any of various forms and need not reside on the printed circuit board but that this is simply the illustrated form.

Pushing the connector pins 12 in the receptor brings the electrostatic discharge protection device 20 into contact with the printed circuit board 36. As the SCP is pushed further down, the resilient bias of the electrostatic discharge protection device 20 is overcome, causing the electrostatic discharge protection device 20 to flatten. Flattening the arcuate shape of the electrostatic discharge protection device 20 forces the ground conductor 28 away from mechanical contact with the connector pins 12 thereby disconnecting the common electrical connection.

The distance between opposed inner edges of the apertures 22 when flattened are substantially identical to the distance between opposed connector pins 12. Maintaining this distance ensures that as the electrostatic discharge protection device 20 flattens the electrostatic discharge protection device 20 remains centered. The centering occurs when one set of inner edge 39 contacts one set of connector pins 12 before the opposed set which forces any remaining movement due to flattening the electrostatic discharge protection device 20 to be toward the opposed set of connector pins 12. The inner edges are each non-conductive to ensure electrical isolation between the connector pins 12.

Once the SCP 10 is soldered or otherwise secured to the printed circuit board 36, a technician can easily inspect the SCP 10 to check that the electrostatic discharge protection device 20 has disconnected all electrical connections. The apertures 22 are made large enough that a gap between the outer conductive edge 38 of the aperture 22 and the connector pins 12 is readily visible for inspection.

If the SCP 10 is later removed from the receptors in the printed circuit board 36, the electrostatic discharge protection device 20 again regains the arcuate shape relative to the central axis to reestablish the electrical connection between the connector pins 12. In this way the electrostatic discharge protection is automatically restored to the SCP 10.

Figure 5:
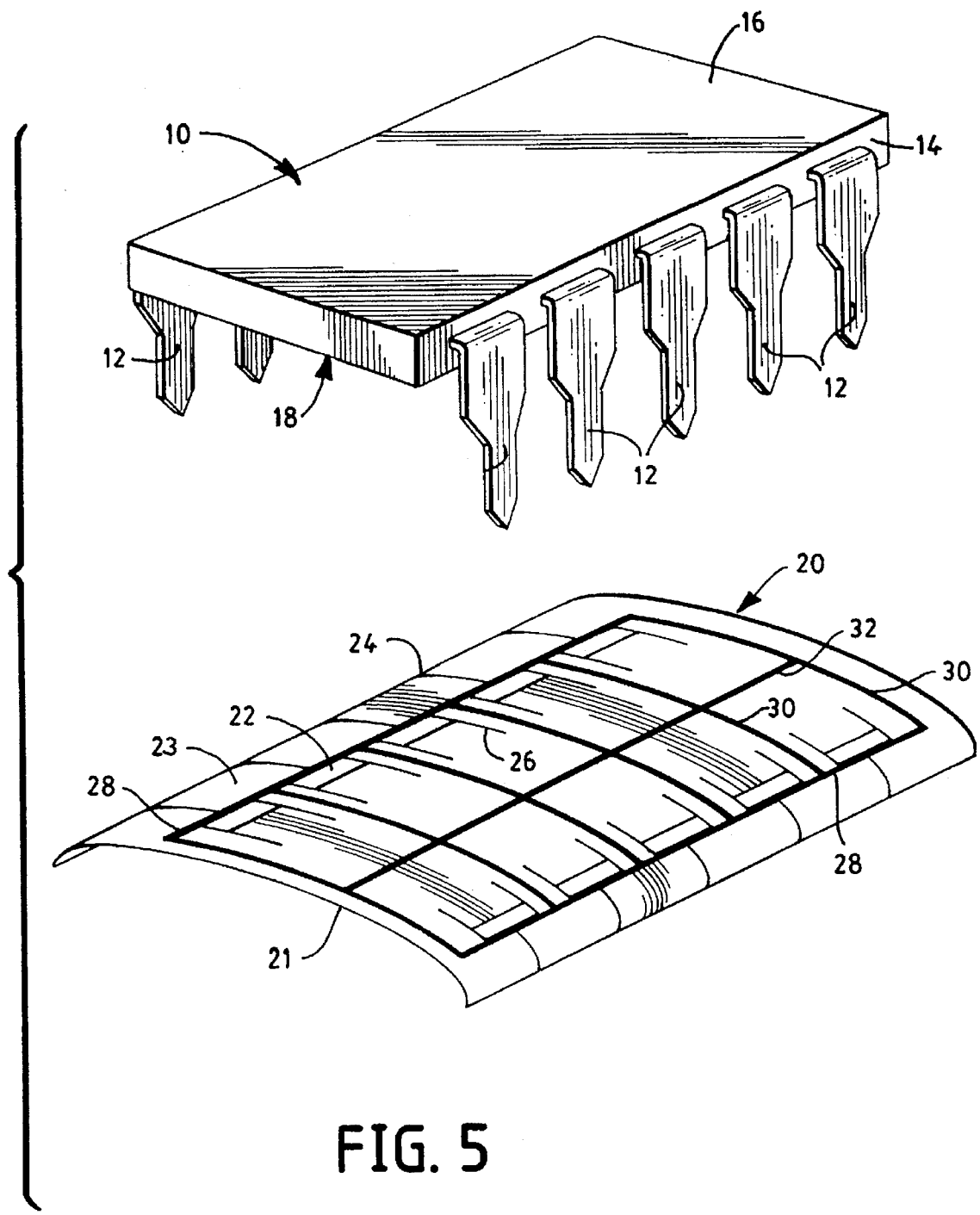
FIG. 5 shows an exploded perspective view of the electrostatic discharge protection device of this invention disposed below a semiconductor chip package.
Figure 6:
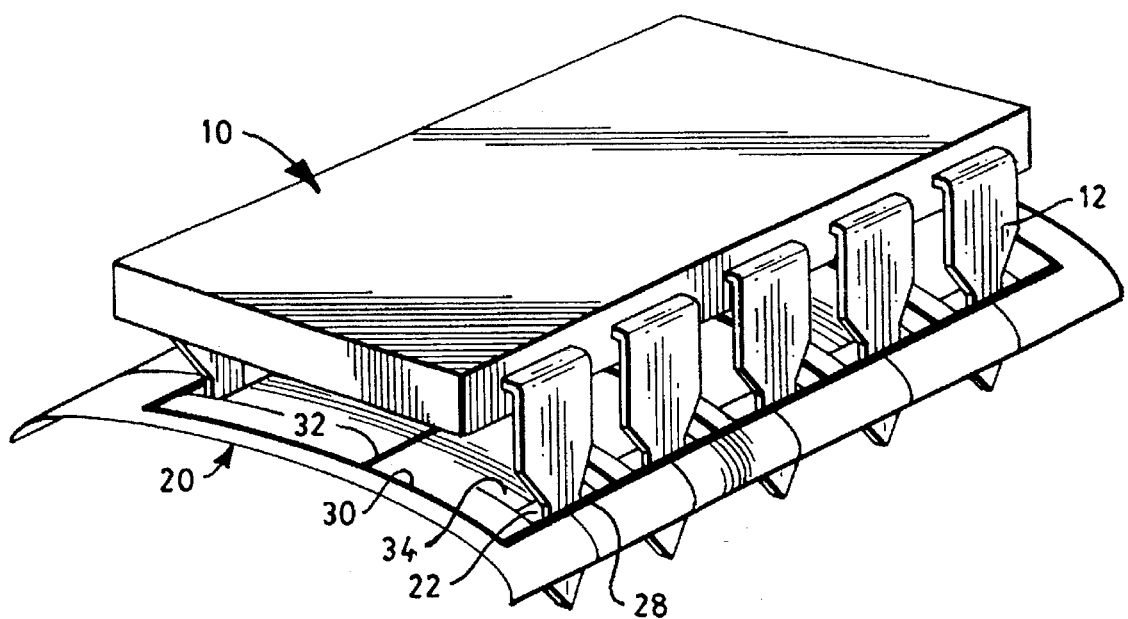
FIG. 6 shows a perspective view of the electrostatic discharge protection device of FIG. 5 mated to the bottom surface of the semiconductor chip package shown in FIG. 5.
Figure 7:
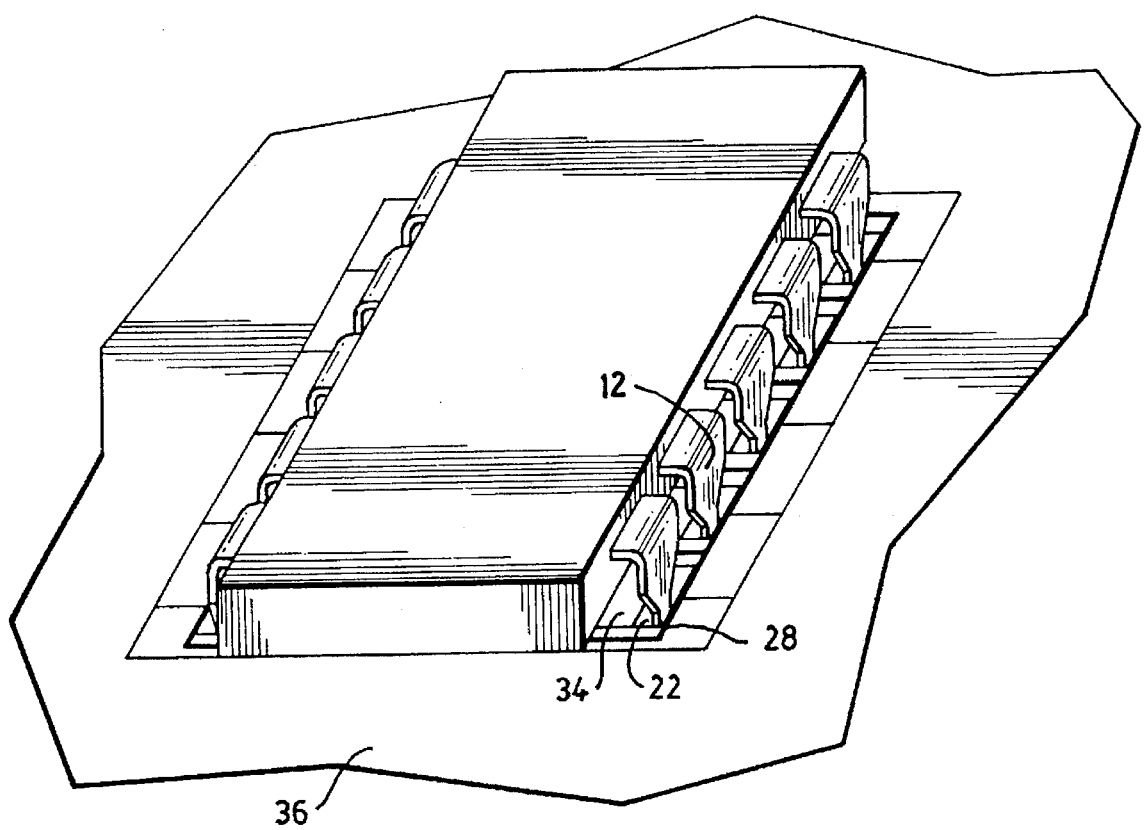
FIG. 7 is a perspective view of the electrostatic discharge protection device assembly as shown in FIG. 6 mated to a printed circuit board.

Referring now to FIGS. 5-7 where like numerals designate previously described elements, there is shown a third embodiment of the electrostatic discharge protection device 60 for the SCP 10. In contrast to the first and second embodiments of the electrostatic discharge protection device 20, this electrostatic discharge protection device 60 is biased in an arcuate shape convex relative to the SCP 10. The conductive overlay 29" is, therefore, located on a bottom surface of the base 21" such that electrical conduction is achieved between the connector pins 12 by connecting bottom portions of the connector pins 12.

Also shown in this embodiment, the conductive overlay does not have to extend to all the connector pins 12 and, therefore, the individual connector pins 12 can optionally be left electrically isolated by simply removing a portion of the conductive overlay 29".

Figure 8A:
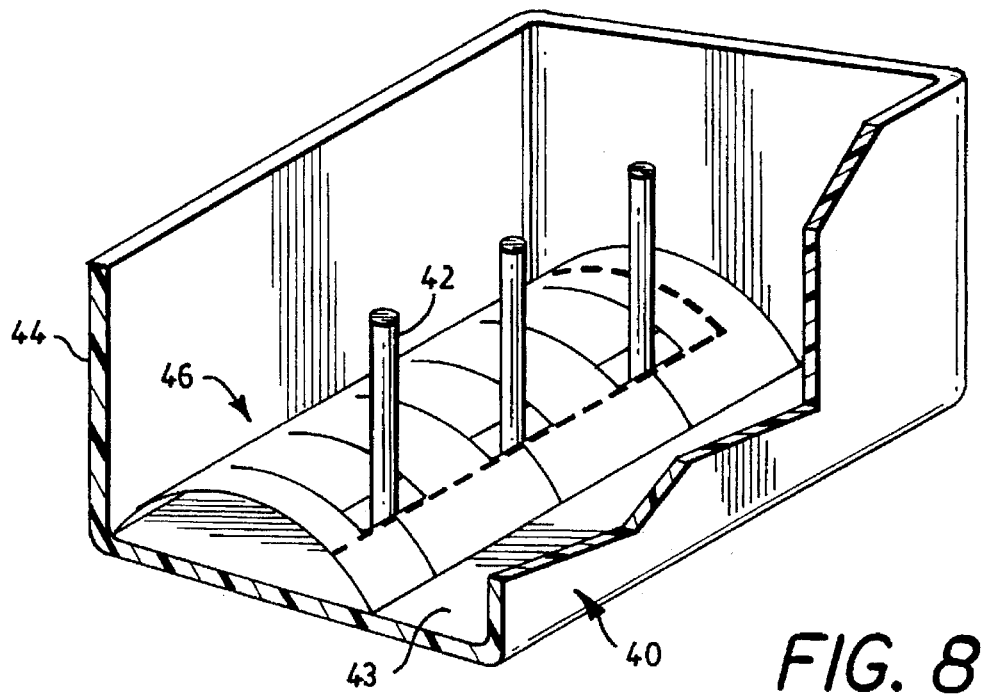
FIG. 8A shows a connector commonly found on printed circuit boards for attaching cables thereto.
Figure 8B:
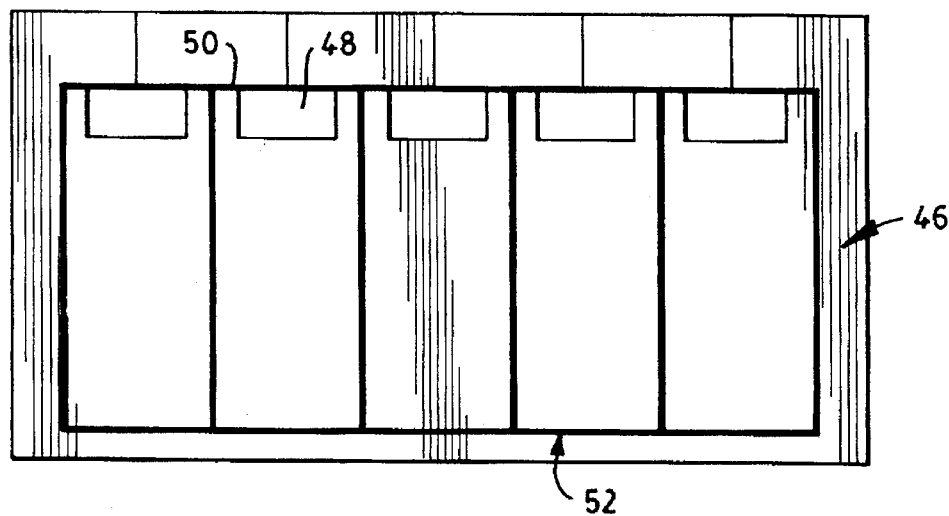
FIG. 8B depicts an electrostatic discharge protection device of this invention.
Figure 8C:
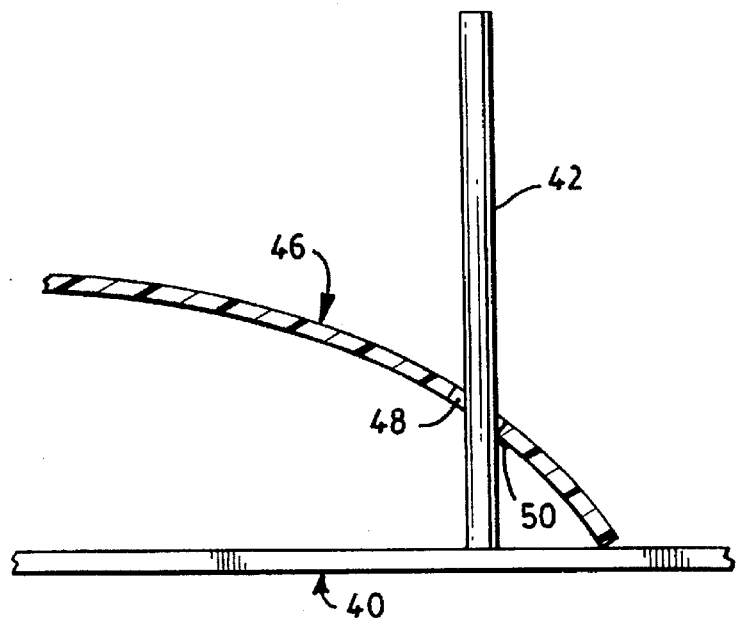
FIG. 8C illustrates a cross-sectional profile view of the electrostatic discharge protection device of FIG. 8B mated to the connector of 8A.
Figure 9:
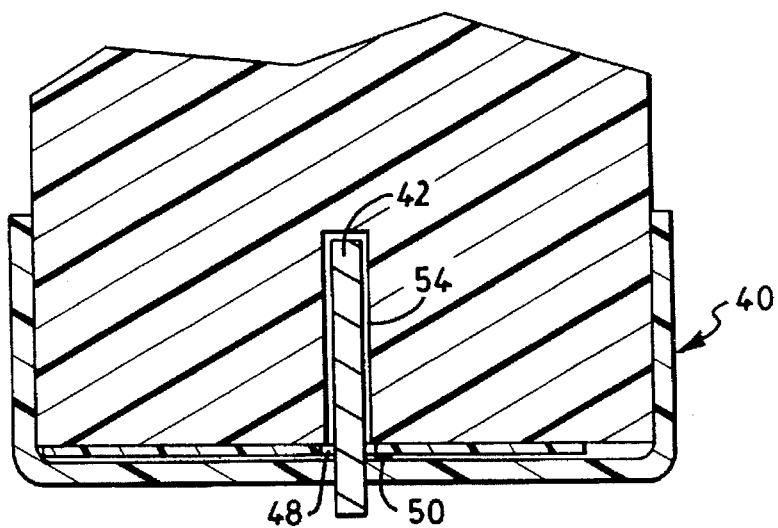
FIG. 9 is a cross-sectional view of the connector with the electrostatic discharge protection device shown therewith as depicted in FIG. 8C with a receptor cable inserted into the connector causing the electrostatic discharge protection device to be moved into in an inoperative position.

Referring now to FIGS. 8 and 9, an alternative embodiment of the invention is shown. FIG. 8A depicts a connector 40 which is commonly found on printed circuit boards for allowing connection to an external cable. The connector often has side walls 44 which extend outward therefrom and one or more rows of connector pins 42 projecting from a bottom portion 43 of the connector 40. An electrostatic discharge protection device 46 is inserted into the connector 40 such that the connector pins 42 extend through the apertures 46.

FIG. 8B and 8C depict in more detail the structure of the electrostatic discharge protection device and the electrical connection to the connector pins 42. As with the first embodiment of the electrostatic discharge protection device 46, there are cuts extending through the base section of the electrostatic discharge protection device 46 allowing freedom of movement for individual connector pins 42. Also like the previous embodiments, the cuts may be formed as full cuts as previously described or as a center cut with two side cuts.

In either case a conductive overlay 52 is placed on the base section with ground conductor 50 running across an outer edge of the aperture 48 thus establishing an electrical connection between selected ones of the connector pins 42. As before, the electrostatic discharge protection device 46 has an arcuate bias forcing the outer ends of the aperture 48 into contact with the connector pins 42.

Insertion of a cable receptor 56 into the connector 40 as shown in FIG. 9 overcomes the aforementioned bias flattening the electrostatic discharge protection device 46. The outer edge of the aperture 48 having the ground conductor attached thereto is, thus, driven away from the connector pin 42 which has now been inserted into ferrule 54 of the cable connector 56. With the electrostatic discharge protection device 46 now substantially flat, the inner edge of the aperture 48 is moved against the conductor pin 42 thus establishing electrical isolation among the connector pins 42.

Withdrawal of the cable receptor 56 from the connector 40 removes the flattening force allowing the electrostatic discharge protection device 46 to reestablish its arcuate shape thus reconnecting the electrical shunt across the selected connector pins 46 provided by the electrostatic discharge protection device 46.

Figure 10:
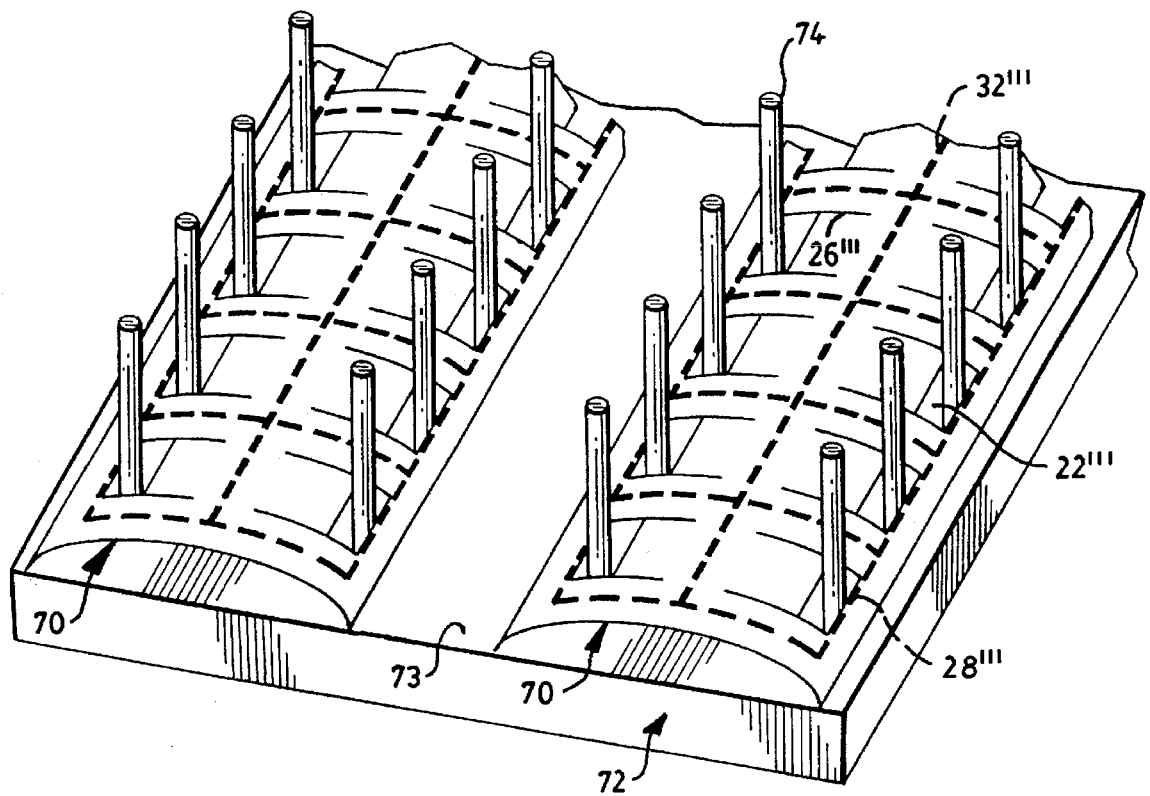
FIG. 10 is a perspective view of a pin grid array semiconductor chip package in combination with an electrostatic discharge protection device.

FIG. 10 shows another embodiment of the invention for use with an SCP 72 having a pin grid arrays ("PGA"). The PGA is a plurality of rows of connector pins 12''' extending down from a bottom portion 73 of the SCP 70. Between each pair of rows of the PGA is placed a electrostatic discharge protection device 70 to protect against electrostatic discharge.

As before, the electrostatic discharge protection device 70 conducts static charge from the connector pins 12''' into a ground conductor 28''' down through an extension 30''' to a central conductor 32''' to ensure that the selected connector pins 12''' are maintained at a common potential.

This embodiment uses multiple electrostatic discharge protection devices 70 as opposed to a single electrostatic discharge protection device ensuring that the electrostatic discharge protection device 70 automatically centers itself upon connection to a receptor.

When inserted into a receptor, the electrostatic discharge protection device 70 automatically withdraws the electrical connection as previously described thus establishing electrical isolation among the connector pins 12''' of the PGA.

Figure 11:
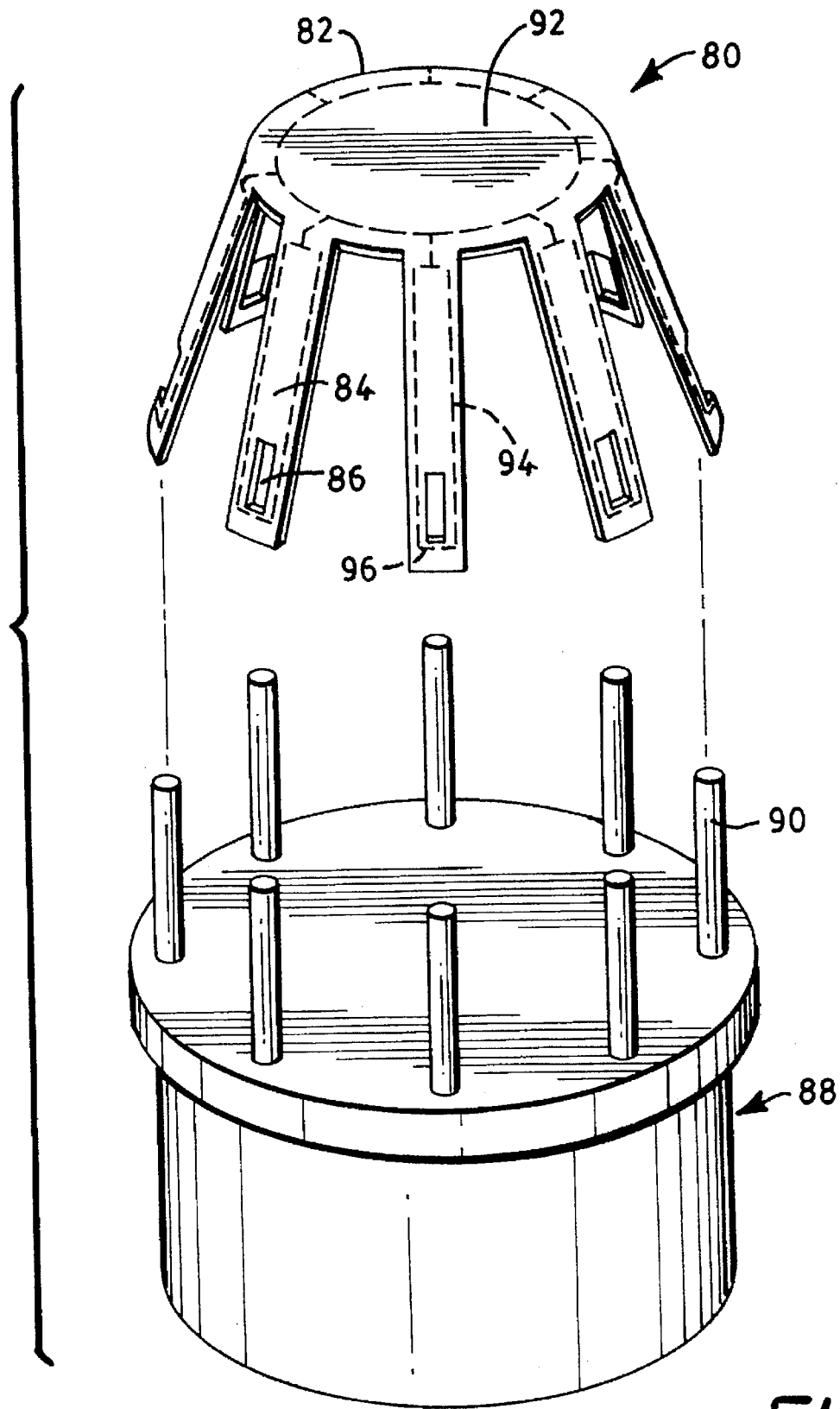
FIG. 11 shows an exploded perspective view of the electrostatic discharge protection device of this invention disposed above a semiconductor chip package which is facing upward.
Figure 12:
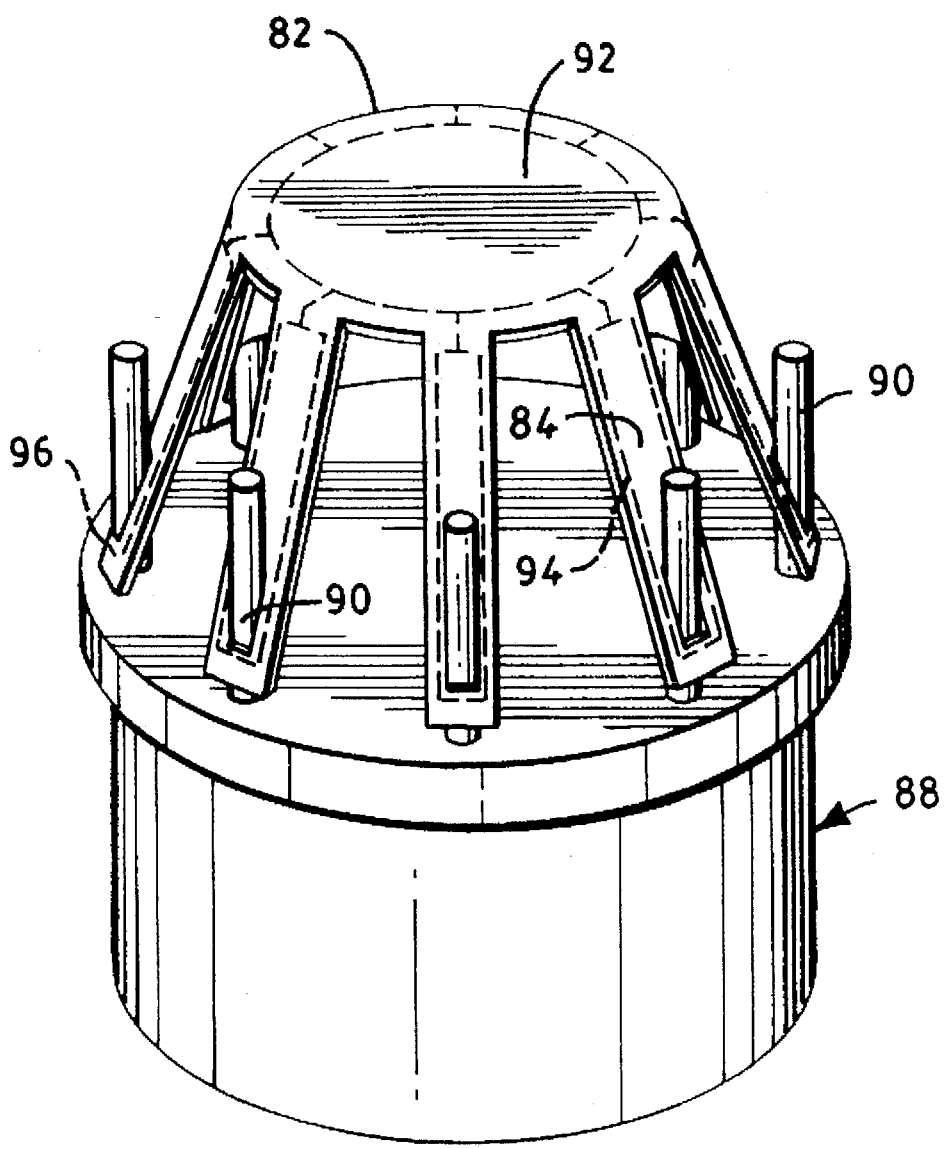
FIG. 12 shows a perspective view of the electrostatic discharge protection device of FIG. 11 mated to the bottom surface of the semiconductor chip package shown in FIG. 11.
Figure 13:
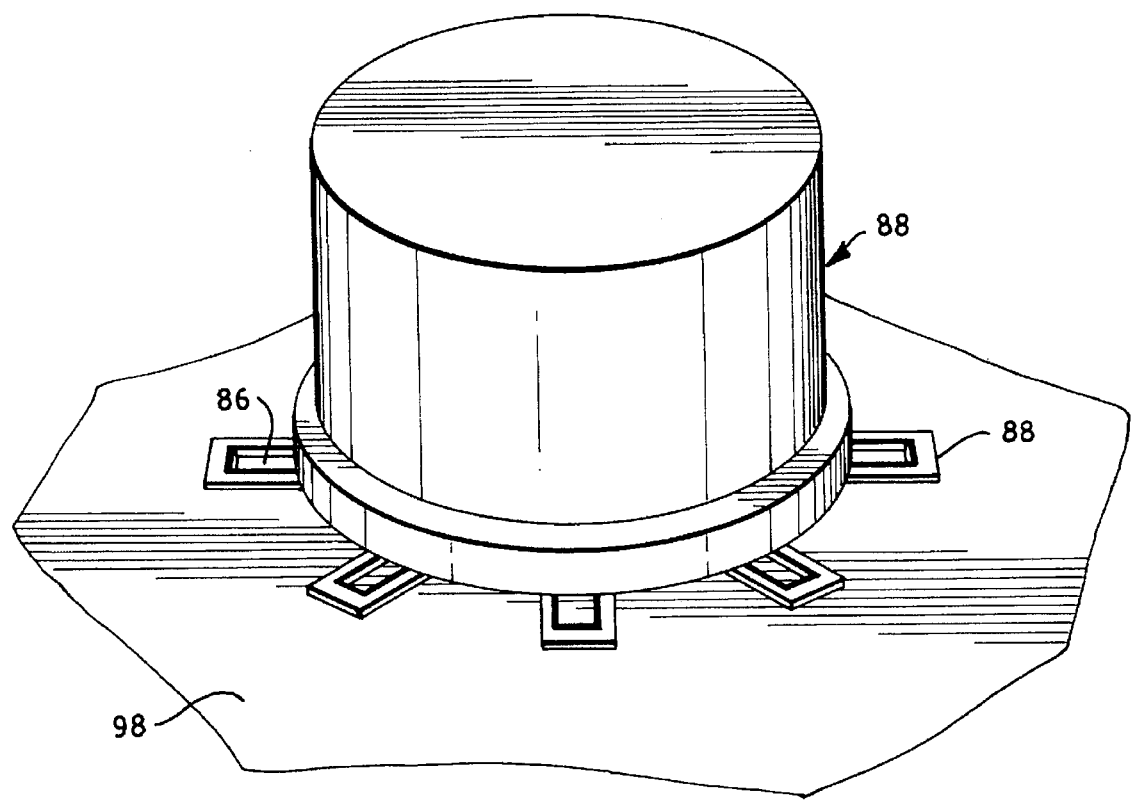
FIG. 13 is a perspective view of the electrostatic discharge protection device assembly as shown in FIG. 11 mated to a printed circuit board.

With reference to FIGS. 11–13, another embodiment of the electrostatic discharge protection device 80 is shown for use with a SCP 88 having connector pins 90 arranged non-linearly. The electrostatic discharge protection device 80 is arranged in a tee-pee style in that a central surface 92 of connection is defined at a top of the electrostatic discharge protection device 80 from which individual legs 83 branch out. The central surface 92 is formed to mimic the non-linear orientation of the connector pins 90 to help accommodate automatic centering of the electrostatic discharge protection device 80 as described hereinafter. In this embodiment, the connector pins 90 have a circular arrangement and, therefore, the central point 82 of connection to the legs 83 is a circular disk shape.

The legs 83 have at their distal ends elongate aperture 86 for receiving the connector pins 90. As with previous embodiments, the outer edge 96 of the elongate aperture 86 is electrically conductive due to a coating of conductive paint or a lamination of conductive metal, inter alia.

Static electricity on the connector pins when in contact with the outer edge 96 of the apertures 86 is then communicated via conductive extensions 94 to a central conductor 92 on the central point 82 to ensure that the selected connector pins 90 are maintained at a common potential.

The legs 83 are fabricated to have an inherent resilient bias to urge the apertures 86 inward toward a central axis 85. In doing so, the electrostatic discharge protection device 80 urges the outer edges 96 into mechanical contact with the connector pins 90. In addition to establishing an electrical connection to the connector pins 90, the bias also serves to secure the electrostatic discharge protection device 80 in place without need of adhesives or additional mechanical connectors.

When inserted into a receptor in a circuit board 98, for example, the electrostatic discharge protection device 80 automatically withdraws the electrical connection to each of the connector pins 90. This is accomplished when the action of pushing the SCP 88 into the receptor overcomes the inherent resilient bias of the electrostatic discharge protection device 80 thus flattening the electrostatic discharge protection device 80. In doing so, the elongate apertures 86 move outward removing mechanical and electrical contact of the outer edges 96 away from the connector pins 90 thus establishing electrical isolation among the connector pins 90 of the SCP 88.

A distance between opposed inner edges of the elongate apertures 86 when flattened is substantially identical to the distance between opposed connector pins 90. Maintaining this distance ensures that when the electrostatic discharge protection device 80 is completely flattened the electrostatic discharge protection device 80 is centered. This automatic centering occurs when one of the inner edges of the elongate apertures 86 contacts one of the connector pins 90 before the opposed one of the inner edges of the elongate apertures 86 contacts the one of the connector pins 90 held within. This contact forces any remaining movement due to flattening the electrostatic discharge protection device 80 to be toward the opposed one of connector pins 90. In the circular arrangement, this occurs for each of the opposed sets of connector pins 90 until the electrostatic discharge protection device 80 is completely centered. Further, the inner edges are each non-conductive to ensure electrical isolation between the connector pins 90.

Once the SCP 88 is soldered or otherwise secured to the printed circuit board 98, a technician can easily inspect the SCP 88 to check that the electrostatic discharge protection device 80 has disconnected all electrical connections. The apertures 86 are made large enough that a gap between the outer conductive edge 96 of the aperture 86 and the connector pins 90 is readily visible for inspection.

If the SCP 88 is later removed from the receptors in the printed circuit board 98, the electrostatic discharge protection device 80 again regains the tee-pee shape relative to the central axis 85 to reestablish the electrical connection between the connector pins 90. In this way the electrostatic discharge protection is automatically restored to the SCP 88.

Figure 14:
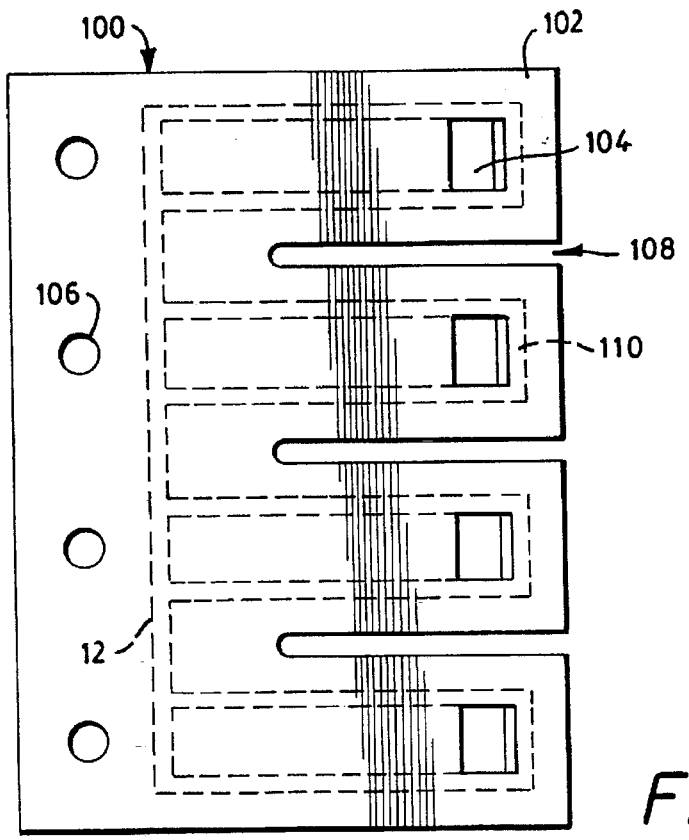
FIG. 14 shows an electrostatic discharge protection device of this invention.
Figure 15:
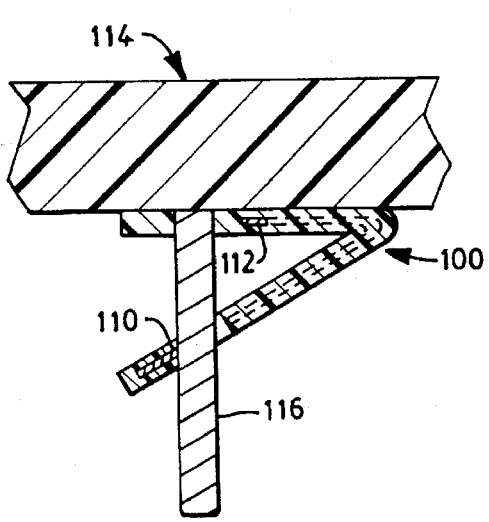
FIG. 15 shows a perspective view of the electrostatic discharge protection device of FIG. 14 mated to a bottom surface of a semiconductor chip package.
Figure 16:
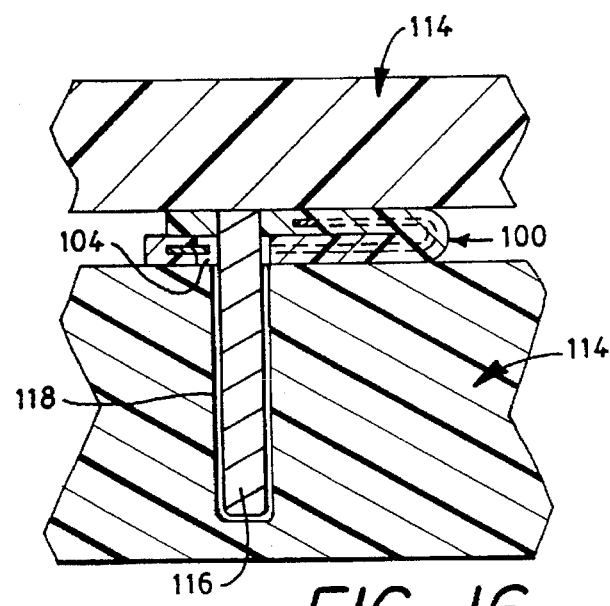
FIG. 16 shows a perspective view of an electrostatic discharge protection device assembly as shown in FIG. 14 mated to a printed circuit board.

With reference to FIGS. 14–16, an embodiment of the electrostatic discharge protection device 100 is shown for use with a single row of connector pins 116 on a SCP 114. One skilled in the art will realize that this embodiment can be used with semiconductor chip packages having multiple rows of connector pins by simply using one electrostatic discharge protection device 100 for each row of connector pins.

The electrostatic discharge protection device 100 is amenable for fabrication using the aforementioned flex-circuit technology and the "full cut" design as depicted by FIG. 2B. The flex-circuit design in this embodiment has a conductive metal layer sandwiched between two non-conductive plastic layers to avoid unintended electrical shunts.

The electrostatic discharge protection device 100 is stamped with tabs 102 which extend out from a central base 103. The tabs each have an aperture 104 cut therein for receiving the connector pins 116.

Holes 106 are also punched into the central base 103 for receiving the connector pins 116 with an interference fit. The connector pins 116 are first placed in the holes 106 to secure the electrostatic discharge protection device 100 on the SCP 114. The electrostatic discharge protection device 100 is folded such that the connector pins 116 pass through the apertures 104.

A ground conductor 110 is cantilevered into the aperture 104 along an outer edge of the aperture 104 as previously described. The ground conductor is connected with a central conductor 112 which in turn is connected to selected other ground conductors 110.

Each of the ground conductors 110 mechanically contact the connector pins 116 to establish an electrical connection therewith thus static electricity on the connector pins 116 is communicated to the central conductor 112 to ensure that the selected connector pins 116 are maintained at a common potential.

The electrostatic discharge protection device 100 is fabricated to have an inherent resilient bias to urge the electrostatic discharge protection device 100 into an unfolded position. When bent over the connector pins 116 as shown in FIG. 15, the apertures 104 are forced upward toward the position moving the ground conductor 110 into electrical contact with the connector pins 116. In addition to establishing an electrical connection to the connector pins 116, the bias also serves to secure the electrostatic discharge protection device 100 in place without need of adhesives or additional mechanical connectors.

When the SCP 114 is inserted into a receptor 118 in a circuit board 115, for example, the electrostatic discharge protection device 100 automatically withdraws the electrical connection to each of the connector pins 116. This is accomplished when the action of pushing the SCP 114 into the receptor overcomes the inherent resilient bias of the electrostatic discharge protection device 80 thus flattening the electrostatic discharge protection device 100. In doing so, the apertures 104 are moved outward removing mechanical and electrical contact of the ground conductor 110 away from the connector pins 116 thus establishing electrical isolation among the connector pins 116 of the SCP 114.

If the SCP 114 is later removed from the receptors 118 in the printed circuit board 115, the electrostatic discharge protection device 100 again unfolds to reestablish the electrical connection between the connector pins 116. In this way electrostatic discharge protection is automatically restored to the SCP 114.

Figure 17:
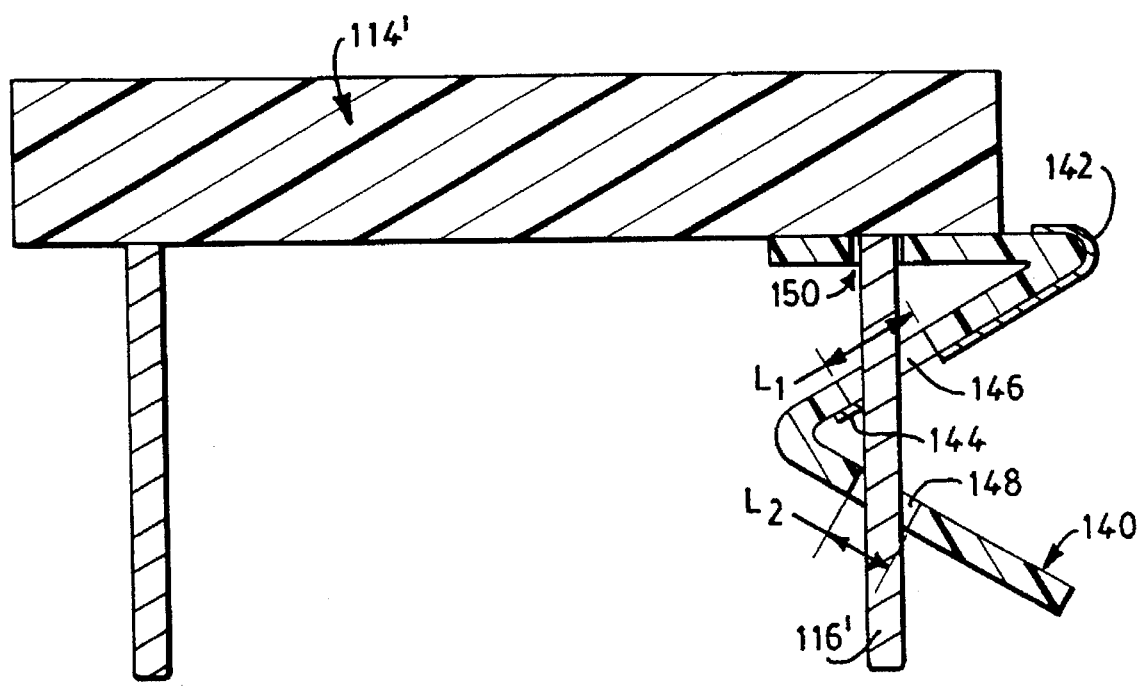
FIG. 17 shows a perspective view of an electrostatic discharge protection device of this invention coupled with a semiconductor chip package.

An electrostatic discharge protection device embodiment similar to the previous embodiment is shown in FIG. 17 where like structures are referred to with like numerals. In this Figure, the electrostatic discharge protection device 140 is stamped with tabs 102' which extend out from a central base 103'. The tabs each having two apertures 104', 148 cut therein for receiving the connector pins 116'.

Holes 106' are also punched into the central base 103' for receiving the connector pins 116' with an interference fit. The connector pins 116' are first placed in the holes 106' to secure the electrostatic discharge protection device 140 on the SCP 114'. The electrostatic discharge protection device 140 is twice folded such that the connector pins 116' pass through the apertures 104' and 148.

A ground conductor 144 is cantilevered into the aperture 104' along an outer edge of the aperture 104' as previously described. The ground conductor 144 is connected with a central conductor 142 which in turn is connected to selected other ground conductors 144.

Each of the ground conductors 144 mechanically contact the connector pins 116' to establish an electrical connection therewith thus static electricity on the connector pins 116' is communicated to the central conductor 142 to ensure that the selected connector pins 116' are maintained at a common potential.

As opposed to the previous embodiment, the tabs 102' of this embodiment extend well beyond the ground conductors 144 and are folded back allowing the conductor pins 116' to pass through the apertures 148. This section of the tab 102' carries no electrical conductors and is fabricated of electrically insulative materials. The nonconductive quality of this section of the tabs 102' provides further protection against accidental electrical shorts when the SCP 114' is connected to a receptor since the nonconductive section of the tab will be pushed up covering substantially all conductive surfaces of the electrostatic discharge protection device 140.

The electrostatic discharge protection device 140 is fabricated to have an inherent resilient bias to urge the electrostatic discharge protection device 140 into an unfolded position. When bent over the connector pins 116 as shown, the apertures 104' are forced downward moving the ground conductor 144 into electrical contact with the connector pins 116'. In addition to establishing an electrical connection to the connector pins 116', the bias also serves to secure the electrostatic discharge protection device 140 in place without need of adhesives or additional mechanical connectors.

When the SCP 114' is inserted into a receptor, the electrostatic discharge protection device 140 automatically withdraws the electrical connection to each of the connector pins 116' as previously herein described. But in this embodiment, the aperture 104' holding the ground conductor 144 is also mechanically driven away from the conductor pin 116'. This is accomplished by the second aperture 148 which has an inner edge which is located farther outward on the tab 102' by an amount $L_2$ than the aperture 104' is inward by an amount $L_1$. The fact that $L_2 > L_1$ ensures that contact of the second aperture 148 with the connector pin 116' will force the ground conductor 144 away from the conductor pin 116' as the electrostatic discharge protection device 140 is pushed into an inoperative position.

If the SCP 114' is later removed from the receptor, the electrostatic discharge protection device 140 again unfolds to reestablish the electrical connection between the connector pins 116'. In this way electrostatic discharge protection is automatically restored to the SCP 114'.

Figure 18:
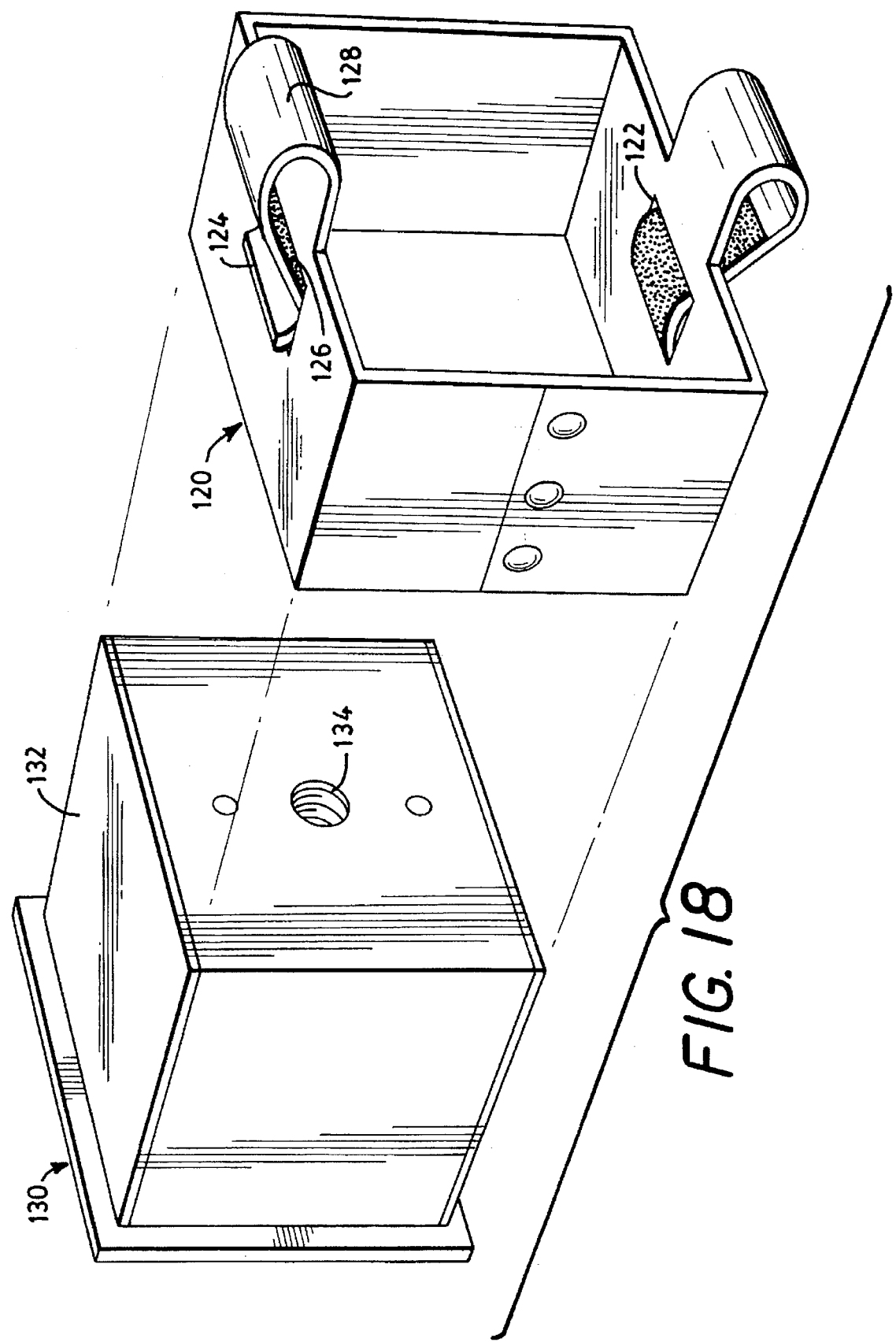
FIG. 18 shows an exploded perspective view of the electrostatic discharge protection device of this invention along with a semiconductor chip package.
Figure 19:
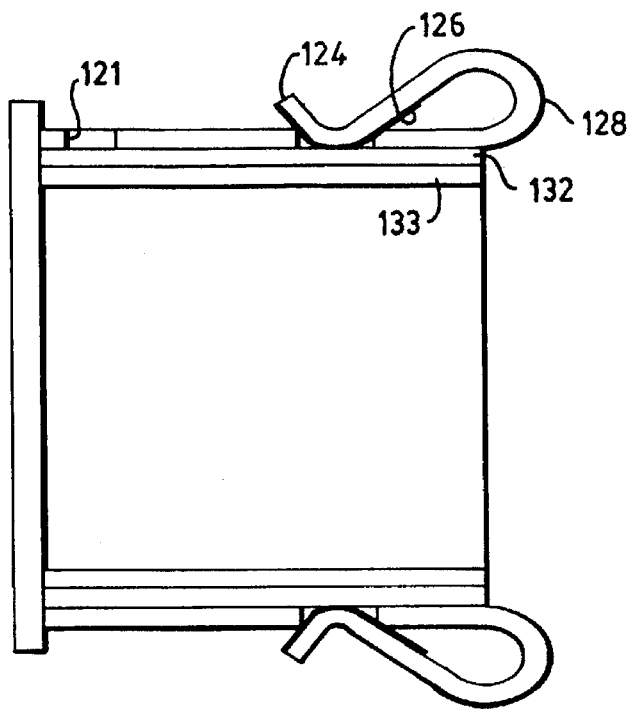
FIG. 19 shows a perspective view of the electrostatic discharge protection device of FIG. 18 mated to the semiconductor chip package shown in FIG. 18.
Figure 20:
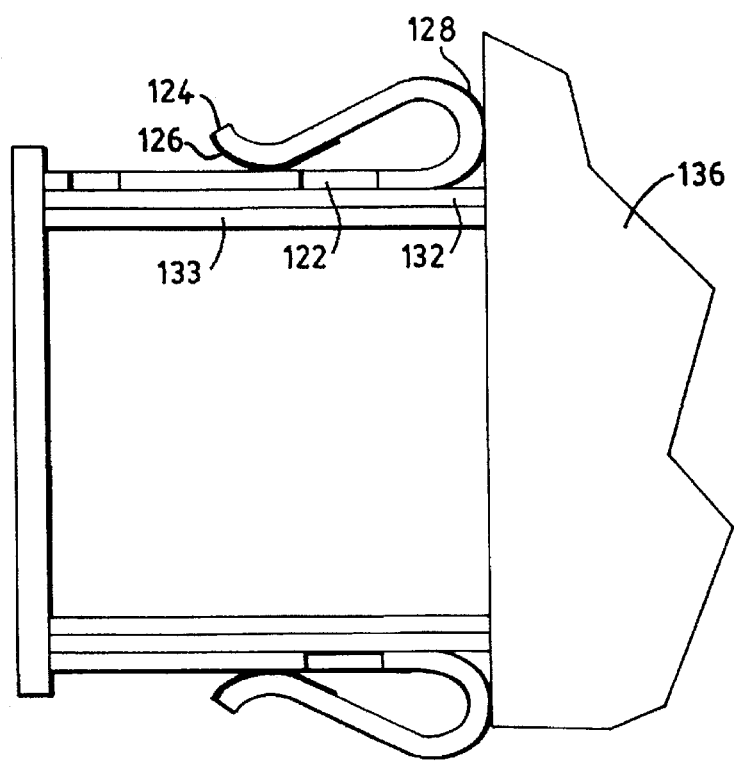
FIG. 20 is a perspective view of the electrostatic discharge protection device assembly as shown in FIG. 18 mated to a heat sink.

An alternative embodiment of the invention is illustrated in FIGS. 18–20 which is useful with a SCP 130 having electrical contacts 132 disposed on one or more lateral surfaces of the SCP 130, such as a laser diode array. The contacts 132 are separated from a conductive enclosure 131, which is usually connected to ground, by an insulator 133.

An electrostatic discharge protection device 120 is formed from a sheet of flat electrically non-conductive base material and is cut to form apertures 122 corresponding to each of the contacts 132. Other apertures #120 provide electrical access to the electrodes of the SCP 130. The electrostatic discharge protection device 120 is then bent such that the SCP 120 fits tightly over the SCP 130. In the illustrated embodiment, the electrostatic discharge protection device 120 is bent to a substantially square form.

The electrostatic discharge protection device 120 is held together using rivets 123 which are electrically conductive and are made to contact the conductive enclosure 131. In this way the rivets 123 essentially become ground terminals on the electrostatic discharge protection device 120.

The electrostatic discharge protection device 120 is held in place in the preferred embodiment by an interference fit over the SCP 130. One skilled in the art will realize that mechanical fastening of the electrostatic discharge protection device 120 can also be used. For example, the rivets 123 can be soldered to the SCP 130, one or more rivets can be replaced by screws which pass into the conductive enclosure 131, et cetera.

Extending outward from a distal end of the electrostatic discharge protection device 120 beyond the apertures is a tab 128 which has a conductive surface 126 formed of a conductive material, such as conductive ink, deposited thereon. The tab 128 is then bent such that the conductive surface 126 passes though the aperture 122 and protrudes from a bottom surface of the electrostatic discharge protection device 120. The tab 128 is fabricated to have an inherent resilient bias to urge the electrostatic discharge protection device 100 downward into the aperture 122. The tab then continues out from the aperture 122 upwards to an endpoint 124 which overlies a surface of the electrostatic discharge protection device 120.

When the electrostatic discharge protection device 120 is placed over the SCP 130, the conductive surface 126 makes mechanical contact with the contact 132 simultaneously establishing an electrical connection therewith.

The conductive surface 126 is integral with a central conductor 127 which is printed along an outer surface of the electrostatic discharge protection device 120 electrically connecting each of the conductive surfaces 126 to the rivets 123. Since the rivets are electrically grounded, this connection via the ground conductor 127 electrically grounds each of the contacts 132.

When the SCP 120 is inserted into a receptor, the electrostatic discharge protection device 120 automatically withdraws the electrical connection to each of the contacts 132. In the case of the illustrated embodiment, the electrical connection is withdrawn when a heat sink 136 is secured to the laser diode array by screwing a bolt from the heat sink 136 into a threaded hole in the SCP 130. The heat sink 136 is dimensionally larger than the electrostatic discharge protection device 120. Therefore, when the heat sink 136 is attached the tabs 128 are pushed forward driving the conductive surfaces 126 out of the apertures 122, the electrical connection between the contacts 132 and the conductive surfaces 126 is removed establishing electrical isolation among the connector pins 116 of the SCP 114.

If the heat sink 136 is later removed from the SCP 130, the electrostatic discharge protection device 120 again reestablishes the electrical connection between the conductive surface 126 and the contacts 132 due to the inherent resilient bias of the electrostatic discharge protection device tab 128. In this way electrostatic discharge protection is automatically restored to the SCP 130.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A method for fabricating an electrostatic discharge protection device for use with a semiconductor chip package of a type having a top surface and an opposite bottom surface and a plurality of lateral surfaces integral with said top and bottom surfaces where the semiconductor chip package has extending therefrom a plurality of connector pins disposed in a spaced apart relationship with respect to each other for insertion into a mating receptacle, said method comprising stamping a base to form a plurality of apertures corresponding to the plurality of connector pins such that the at least one row of connector pins pass through the plurality of apertures and to form one or more cuts in the base transverse to the central axis of the base such that an area surrounding each of the plurality of apertures is free to move at an angle relative to a plane of the base;

depositing a conductive material on said base to provide electrical communication between outer portions of the plurality of apertures; and shaping said base to have a resilient bias to urge the outer portions of the plurality of apertures into contact with the connector pins such that the electrostatic discharge protection device has an operative position for connecting a shunt across selected pins of the connector pins and has an inoperative position for disconnecting said shunt to provide electrical isolation between the connector pins where insertion of said semiconductor chip package into said mating receptacle moves the base into the inoperative position by overcoming the inward bias and removal of the semiconductor chip package from the mating receptacle automatically moves the base into said operative position.

2. The method according to claim 1 wherein said step of depositing comprises a step of coating a conductive ink onto said base.

3. The method according to claim 1 wherein said step of depositing further comprises a step of applying the conductive material in excess over the outer portions of the plurality of apertures to ensure mechanical contact with the connector pins.

4. The method according to claim 3 wherein said step of depositing further comprises a step of photo-etching the conductive material to form the apertures.

5. The method according to claim 3 wherein said step of depositing further comprises a step of mechanically punching the conductive material to form the apertures.

6. The method according to claim 1 wherein said step of depositing comprises a step of laminating a conductive material onto said base.

* * * * *